US006949439B2

(12) United States Patent
Flohrs et al.

(10) Patent No.: US 6,949,439 B2
(45) Date of Patent: Sep. 27, 2005

(54) SEMICONDUCTOR POWER COMPONENT AND A METHOD OF PRODUCING SAME

(75) Inventors: Peter Flohrs, Reutlingen (DE); Robert Plikat, Vaihingen (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 111 days.

(21) Appl. No.: 10/450,222

(22) PCT Filed: Mar. 26, 2002

(86) PCT No.: PCT/DE02/01099

§ 371 (c)(1),
(2), (4) Date: Jun. 11, 2003

(87) PCT Pub. No.: WO02/082552

PCT Pub. Date: Oct. 17, 2002

(65) Prior Publication Data

US 2004/0021203 A1 Feb. 5, 2004

(30) Foreign Application Priority Data

Apr. 7, 2001 (DE) ......................... 101 17 483

(51) Int. Cl.$^7$ ......................................... H01L 21/8224
(52) U.S. Cl. .................. 438/336; 257/497; 257/578
(58) Field of Search ................... 438/173, 192, 438/202, 206–212, 309, 335–337; 257/497–498, 565, 578, 592

(56) References Cited

U.S. PATENT DOCUMENTS 6,734,520 B2 * 5/2004 Kapels et al. ............... 257/483

FOREIGN PATENT DOCUMENTS

| DE | 31 10 230 | 1/1982 |
|----|-----------|--------|
| EP | 0 969 501 | 1/2000 |
| EP | 1 017 093 | 7/2000 |
| JP | 02 001985 | 1/1990 |

OTHER PUBLICATIONS

Yamashita et al., "A Relation between Dynamic Saturation Characteristics and Tail Current of Nonpunchthrough IGBT", Industry Applications Conference, IAS 1996, Thrity–First IAS Annual Meeting, 1996, Conference Record of the 1996 IEEE San Diego, CA, Oct. 6–10, 1996, pp. 1425–1432.
C. Yun et al., "High Performance 1200C PT IGBT with Improved Short–Circuit Immunity", Proceedings of the 10$^{th}$ International Symposium on Power Semiconductor Devices and IC's, ISPSD 1998, Jun. 3, 1998, pp. 261–264.***
Patent Abstracts of Japan, vol. 014, No. 133, Mar. 13, 1990.
Laska et al., *Solid–State Electronics*, vol. 35, No. 5, pp. 681–685.**
T. Laska et al., *Conf. Proc. ISPSD*, 1997, pp. 361–364.**
K. D. Hobart et al., *1999 Proc. IEEE*, pp. 45–48.**
J. Yedinak et al., *Conf. Proc. ISPSD*, 1998, pp. 399–402.**
Takei et al., *Conf. Proc. ISPSD*, 1999, Appendix Paper 7.1.*

* cited by examiner

Primary Examiner—David Nelms
Assistant Examiner—Calvin Lee
(74) Attorney, Agent, or Firm—Kenyon & Kenyon

(57) ABSTRACT

A semiconductor power component and a method for producing a semiconductor power component, in particular a vertical NPT-IGBT for ignition applications with a breakdown voltage of less than approx. 1000 V. The semiconductor power component includes a wafer substrate of a first conductive type including a rear-side emitter region of a second conductive type and a front-side drift region of the first conductive type; a rear-side anode contact which is connected to the emitter region and extends partially to the front-side surface; a front-side MOS control structure; and a front-side cathode contact which is connected to a front-side source region and a body region of the front-side MOS control structure. The thickness of the drift region is much larger than the width of the space charge region at a defined breakdown voltage; and the thickness of the rear-side emitter region is greater than 5 μm.

14 Claims, 3 Drawing Sheets

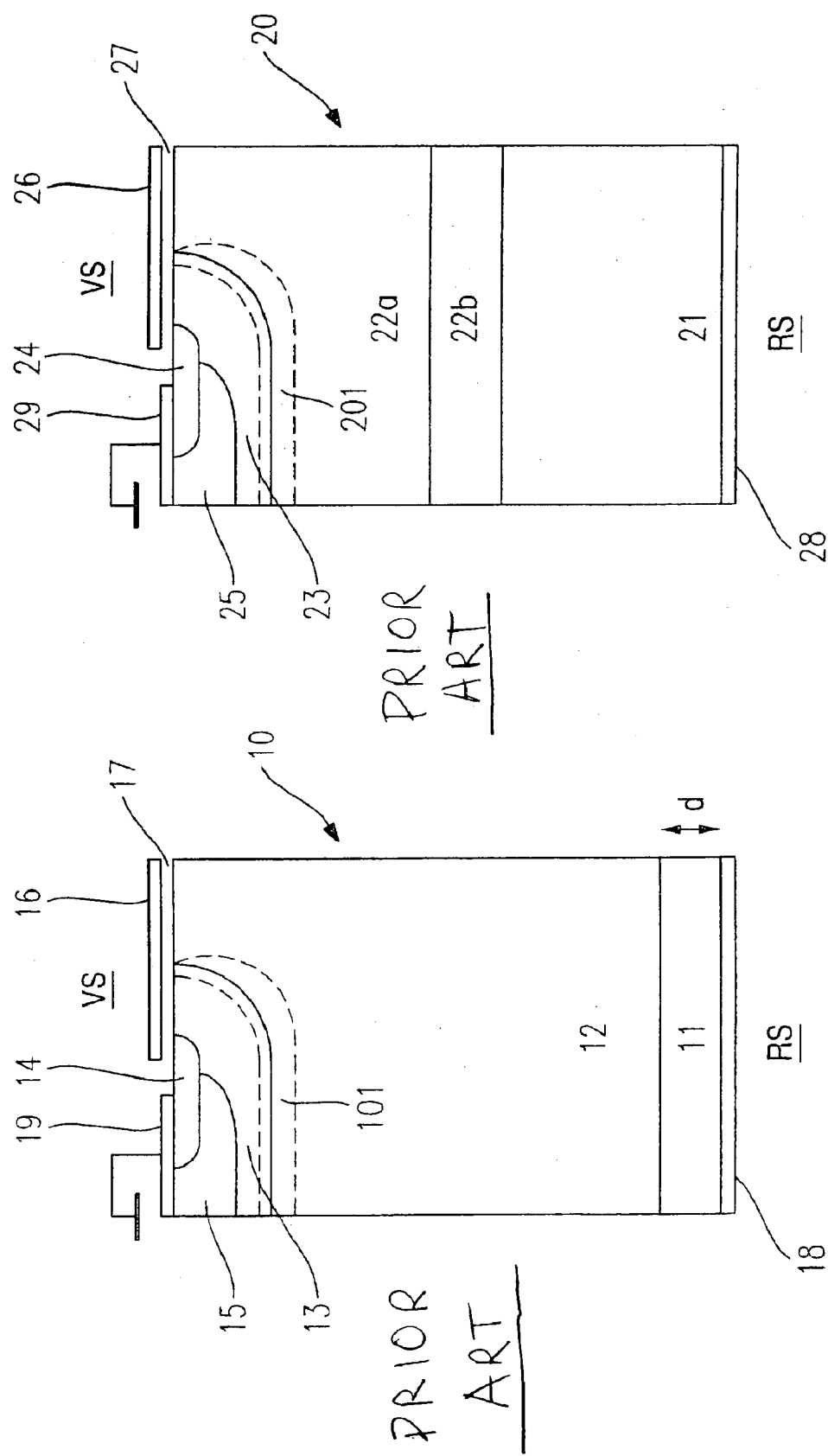

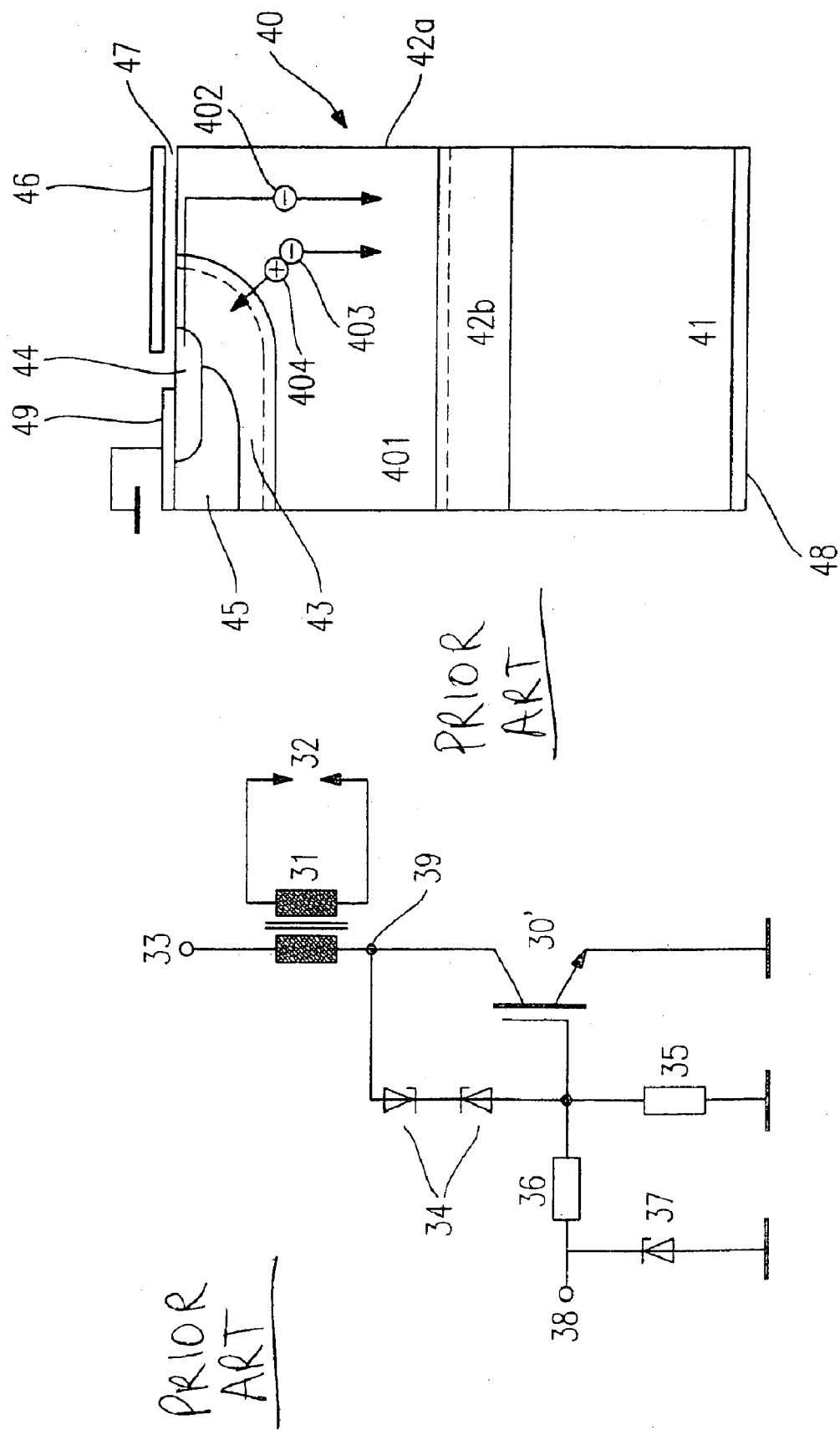

SEMICONDUCTOR POWER COMPONENT AND A METHOD OF PRODUCING SAME

FIELD OF THE INVENTION

The present invention relates to a semiconductor power component and a method of producing a semiconductor power component.

BACKGROUND INFORMATION

Although applicable to other similar semiconductor power components, the present invention and the problems on which it is based are described here with respect to a vertical IGBT (insulated gate bipolar transistor).

In general, IGBTs are used as power circuit-breakers in a cutoff voltage range from a few hundred volts to a few thousand volts. In particular, the use of such IGBTs as an ignition transistor, i.e., as a switch on the primary side of an ignition coil, is of particular interest.

The structure of a vertical IGBT resembles that of a VDMOS transistor, except that a $p^+$ emitter is arranged on its anode side instead of an $n^+$ substrate as in the VDMOS transistor. German Published Patent Application No. 31 10 230 discusses a vertical MOSFET component having the basic structure of a vertical IGBT. In principle, two types of vertical IGBT or V-IGBT are differentiated, namely the punch-through IGBT (PT) and the non-punch-through IGBT (NPT), as discussed by Laska et al., *Solid-State Electronics*, volume 35, no. 5, pages 681–685, for example.

The basic properties of these two types of IGBTs are described below with reference to FIGS. 2 and 3.

FIG. 2 shows a schematic cross-sectional diagram of an NPT-IGBT whose active region 10 includes cellular or strip-shaped MOS control heads 13, 14, 15, 16, 17. In particular, this shows a p-type body region 13, an $n^+$ source 14, a $p^+$ contact diffusion 15 for connecting p-type body region 13 to a cathode terminal 19, which is connected at the same time to $n^+$ source region 14 and is at ground; there is also a gate electrode 16 and a gate oxide 17. In addition, there is an n-drift region 12, a p-emitter 11 on the rear side and an anode terminal 18; "d" denotes the thickness of $p^+$ emitter 11 and 101 is a space charge region formed at the pn junction between p-type body region 13 and n-drift region 12.

The NPT-IGBT according to FIG. 2 may be produced on a low-doped $n^-$ substrate having a long charge carrier lifetime. After penetration of the diffusion profiles on the front side VS of the wafer to create MOS control heads 13, 14, 15, 16, 17, $p^+$ emitter 11 is produced in a very shallow form with only a few $\mu m$ depth of penetration (d≈few $\mu m$) and poor emitter efficiency on the rear side RS of the wafer. This transparent emitter region 11 has the function of ensuring a rapid shutdown of the current in dynamic operation of this component, with the goal of minimizing shutdown losses. To obtain satisfactory transmission properties despite such a poor emitter region 11, the carrier lifetime in the $n^-$ drift region 12 must be as high as possible. Furthermore, the thickness of $n^-$ drift region 12 is to be as small as possible, taking into account the desired blocking ability of the component. As a result of this, very thin wafers must be processed, especially in the range of blocking abilities of around 1 kV. This is a highly complex procedure and has become possible only in recent years (see, for example, T. Laska et al., *Conf. Proc. ISPSD '97*, pages 361–364).

FIG. 3 shows a schematic cross-sectional diagram of a PT-IGBT whose active region 20 includes cellular or strip-shaped MOS control heads 23, 24, 25, 26, 27. In particular, this shows a p-type body region 23, an $n^+$ source region 24, a $p^+$ contact diffusion 25 for connecting p-type body region 23 to a cathode terminal 29, which is connected at the same time to $n^+$ source region 24; there is also a gate electrode 26 and a gate oxide 27. In addition, there is an $n^-$ drift region 22a and an $n^-$ buffer region 22b, a $p^+$ emitter 21 on the rear side and an anode terminal 28; 201 denotes a space charge region formed at the pn junction between p-type body region 23 and $n^-$ drift region 22a.

The PT-IGBT according to FIG. 3 may be produced on a thick $p^+$-doped substrate, which at the same time forms rear-side emitter region 21, with epitactically applied n-buffer region 22b and epitactically applied $n^-$ drift region 22a. Since the thickness of $n^-$ drift region 22a is selected to be lower than required by the width of space charge region 201 in the drift region at the desired blocking ability to achieve the lowest possible on-state voltage drop, n-buffer region 22b has the function of preventing the space charge region from extending through to $p^+$ emitter 21. To be able to achieve a rapid shutdown of the current despite good emitter 21, the charge carrier lifetime is kept small by lifetime killing, e.g., by electron bombardment, and/or the doping in n-buffer region 22b is selected to be high accordingly. The on-state voltage becomes higher with an increase in the buffer dose, so a good compromise may be achieved between the on-state voltage and the shutdown performance when using a highly doped thin buffer region 22b. Such as buffer is feasible only to a limited extent in the production of crude wafers using such a double EPI/substrate wafer due to buffer outward diffusion.

Therefore, there have been studies of PT-IGBTs on SDB (silicon direct bonding) wafers such as that already published by C. Yun et al., *Conf. Proc. ISPSD '98*, pages 261–264. With these SDB wafers, a buffer implant is introduced into an $n^-$ wafer of FZ silicon, and then this wafer is bonded directly to a $p^+$ wafer of CZ silicon and healed. The resulting SDB crude wafer having the layer sequence $n^- n^+ p^+$ is then ground to the standard thickness and forms the starting basis for the production of PT-IGBTs according to the standard methods of semiconductor technology. This procedure may provide that with such SDB wafers, it is possible to produce very thin buffer regions having a high doping.

In an article by K. D. Hobart et al., 1999 *Proc. IEEE*, pages 45–49, an NPT-IGBT on SDB wafer material is discussed. In this case, however, the component is first produced on a standard $n^-$ wafer of FZ silicon including metallization. The bonding process with the method discussed there is complex and is performed following thin grinding of the wafer in a low-temperature process (T<450° C.) so as not to damage the IGBT structure which has already been metallized. Either an identical IGBT wafer or a $p^+$ wafer is used as the bonding partner.

A brief explanation of the functioning of the IGBT types described here is given below.

For the on-state case with both types of IGBTs, gate electrode 16 or 26 is brought to a potential above the threshold voltage of MOS control heads 13, 14, 15, 16, 17 or 23, 24, 25, 26, 27, respectively, with respect to cathode terminal 19 or 29. Then an inversion channel is produced on the semiconductor surface beneath gate terminal 16 or 26 in the area of p-type body region 13 or 23. The semiconductor surface in the region of $n^-$ drift region 12 or 22a is then in the condition of accumulation. When there is a positive voltage at anode terminal 18 or 28 with respect to the cathode, electrons are injected into body regions 13 or 23 via n$^+$ source regions 14 or 24, the MOS channels thus influenced, and the accumulation layer is injected into n$^-$ drift region 12 or 22a.

Then anode-side emitter region 11 or 21 injects holes through which n$^-$ drift region 12 or 22a is flooded with charge carriers so that its conductivity is increased. It is in the high injection phase at on-state current densities. Therefore, an IGBT having a blocking ability above approx. 150–200 V is capable of carrying higher current densities having a lower voltage drop between the anode and cathode than a MOS transistor having the same breakdown voltage. In the on-state case, the current flows from the anode to the cathode. It is carried by electrons which are injected into n$^-$ drift region 12 or 22a and flow out via anode-side emitter 11 or 21 to the anode and by holes which are injected by the anode-side emitter into n$^-$ drift region 12 or 22a and flow toward the cathode via p-type regions 13, 15 or 23, 25.

In the blocking case, gate electrode 16 or 26 is brought to a voltage below the threshold voltage with respect to cathode terminal 19 or 29. If anode terminal 18 or 28 is then brought to a positive potential, then space charge region 101 or 201 arranged between p-type body region 13 or 23 and n$^-$ drift region 12 or 22a expands almost exclusively into n$^-$ drift region 12 or 22a.

In the case of NPT-IGBT, the thickness of n$^-$ drift region 12 is selected to be larger than the width of space charge region 101 at a given maximum blocking ability of the component.

With the PT-IGBT, the thickness of n$^-$ drift region 22a is selected to be smaller than the width of the space charge region at a given maximum blocking ability of the component. To prevent space charge region 201 from running over onto p$^+$ emitter region 21, n-doped buffer region 22b is introduced with the goal of preventing said punch-through.

FIG. 4 shows a circuit topology of another system in which a vertical IGBT 30' is used as an ignition transistor in the primary circuit of an ignition coil for an internal combustion engine. For this application as an ignition transistor having the required blocking capacities of approx. 400–600 V, so far only PT-IGBTs on double EPI/substrate crude wafers have been used, thereby avoiding the problems of thin wafers with NPT-IGBTs as described above.

According to FIG. 4, vertical IGBT 30' is connected to battery voltage 33 across an ignition coil 31. A spark plug 32 is provided on the secondary side of ignition coil 31. A diode 37 which is connected to control terminal 38 provides ESD protection, and resistors 35, 36 (e.g., where R36=1 kΩ and R35=10–25 kΩ) define the input resistance of the configuration as well as form the load of a clamping diode chain 34. Elements 30, 34, 35, 36, 37 may be monolithically integrated, diodes 37, 34 normally being made of polysilicon.

The circuit configuration according to FIG. 4 is operable directly by a suitable control unit via control terminal 38. To do so, a positive voltage of 5 V, for example, is applied to control terminal 38, whereupon a current increase is initiated through ignition coil 31. At a certain point in time, the voltage at control terminal 38 is reduced in increments to approx. 0 V, whereupon the voltage at node 39 increases steeply. This voltage increase is stepped up on the secondary side of ignition coil 31 and results in an ignition spark at spark plug 32.

Clamping diode chain 34 has the function of limiting the voltage rise at anode 39 to what is called the terminal voltage of approx. 400 V to protect IGBT 30' and also to protect the other circuit components. This is important in particular in the pulse case which occurs, for example, when no ignition spark is generated, e.g., due to an ignition cable having fallen off. Then IGBT 30' has to absorb the energy otherwise converted in the spark. Without such a voltage limitation, the anode voltage at node 39 would increase to the point of breakdown of IGBT 30' and would destroy it. This is prevented by clamping diode chain 34 by the fact that on reaching a preselected terminal voltage, the gate of IGBT 30' is triggered just strongly enough to prevent the voltage from exceeding the terminal voltage at node 39. Nevertheless, this operating case makes high demands on the pulse strength of IGBT 30' due to the high energy converted, and it is not always possible to ensure these demands will be met to an adequate extent. The negative consequence would be destruction of IGBT 30'.

J. Yedinak et al., *Conf. Proc. ISPSD*, 1998, pages 399–402 have shown that a failure consequently occurs, as described in conjunction with FIG. 5.

FIG. 5 shows a schematic cross-sectional diagram of a PT-IGBT whose active region 40 includes cellular or strip-shaped MOS control heads 43, 44, 45, 46, 47. In particular, this shows a p-type body region 43, an n$^+$ source region 44, a p$^+$ contact diffusion 45 for connecting p-type body region 43 to a cathode terminal 49, which is connected at the same time to n$^+$ source region 44; this also shows a gate electrode 46 and a gate oxide 47. In addition, there is an n$^-$ drift region 42a and an n-buffer region 42b, a rear-side p+emitter 41 and an anode terminal 48; 401 denotes a space charge region formed at the pn junction between p-type body region 43 and n$^-$ drift region 42a.

In the pulse case, space charge region 401 covers entire n$^-$ drift region 42a. Electrons 402 are injected via the MOS channel that has developed in p-type body region 43 into n$^-$ drift region 42a, triggering p$^+$ emitter 41 via a triggering of the gate controlled by said clamping diodes. Gain factor β of the pnp transistor formed by regions 41, 42a, 42b, 43 is higher at a high voltage than in the on state (see Takei et al., *Conf. Proc. ISPSD*, 1999, Appendix Paper 7.1), which is why a low triggering voltage at gate terminal 46 is sufficient to carry the load current and thus to limit the anode voltage to the terminal voltage. Due to the power loss which thus occurs, the component becomes very hot at the cathode in particular, whereupon an electron leakage current occurs. Electrons 403 run in the direction of the anode and control bias p$^+$ emitter region 41 there. They thus act like an additional triggering of the IGBT. To keep the voltage at the level of the terminal voltage, triggering of gate terminal 46 is reduced via the terminal diode chain accordingly. Under certain operating conditions, the triggering due to the thermally induced electron leakage current is so strong that the IGBT is able to carry the load current without any gate control. Its controllability is lost. The temperature increases further and the leakage current also increases further, ultimately resulting in positive thermal feedback and destruction of the IGBT.

SUMMARY OF THE INVENTION

It is an object of the present invention to provide a rugged IGBT for ignition applications in particular, so that the IGBT will have good on-state properties and a high pulse strength and will be easily processable.

The semiconductor power component according to the present invention may provide that a rugged IGBT is made available without the need for processing thin wafers.

The present invention provides for a wafer substrate of a first conductive type including a rear-side emitter region of a second conductive type and a front-side drift region of the first conductive type, the thickness of the drift region being much greater than the width of the space charge region at a defined breakdown voltage, and the thickness of the rear-side emitter region being greater than 5 µm.

According to an exemplary embodiment, the breakdown voltage is less than 1000 V, the thickness of the drift region between the front-side MOS control structure and the rear-side emitter region being greater than 200 µm.

According to another exemplary embodiment, the rear-side emitter region is a diffusion region.

According to another exemplary embodiment, the substrate is an SDB substrate.

According to another exemplary embodiment, the rear-side emitter region is an epitaxy region.

According to another exemplary embodiment, the thickness of the drift region between the front-side MOS control structure and the rear-side emitter region is at least 20 µm greater than the width of the space charge region at the defined breakdown voltage.

According to another exemplary embodiment, the thickness of the drift region between the front-side MOS control structure and the rear-side emitter region is selected so that the temperature increase in the rear-side emitter region up to the point in time at which the front side has reached a defined maximum temperature in the pulse case does not exceed a value of approx. 50 K.

According to another exemplary embodiment, the first conductive type is the n type, and the second conductive type is the p type.

According to another exemplary embodiment, the drift region has a carrier lifetime of more than 10 µs in the high injection case.

BRIEF DESCRIPTION OF THE DRAWINGS

FIG. 2 shows a schematic cross-sectional diagram of a NPT-IGBT of another system.

FIG. 3 shows a schematic cross-sectional diagram of a PT-IGBT of another system.

FIG. 4 shows a circuit topology of another system in which a vertical IGBT is used as the ignition transistor in the primary circuit of an ignition coil for an internal combustion engine.

FIG. 5 shows a schematic cross-sectional diagram of a NPT-IGBT of another system to illustrate a failure mechanism.

DETAILED DESCRIPTION

Figure 1:
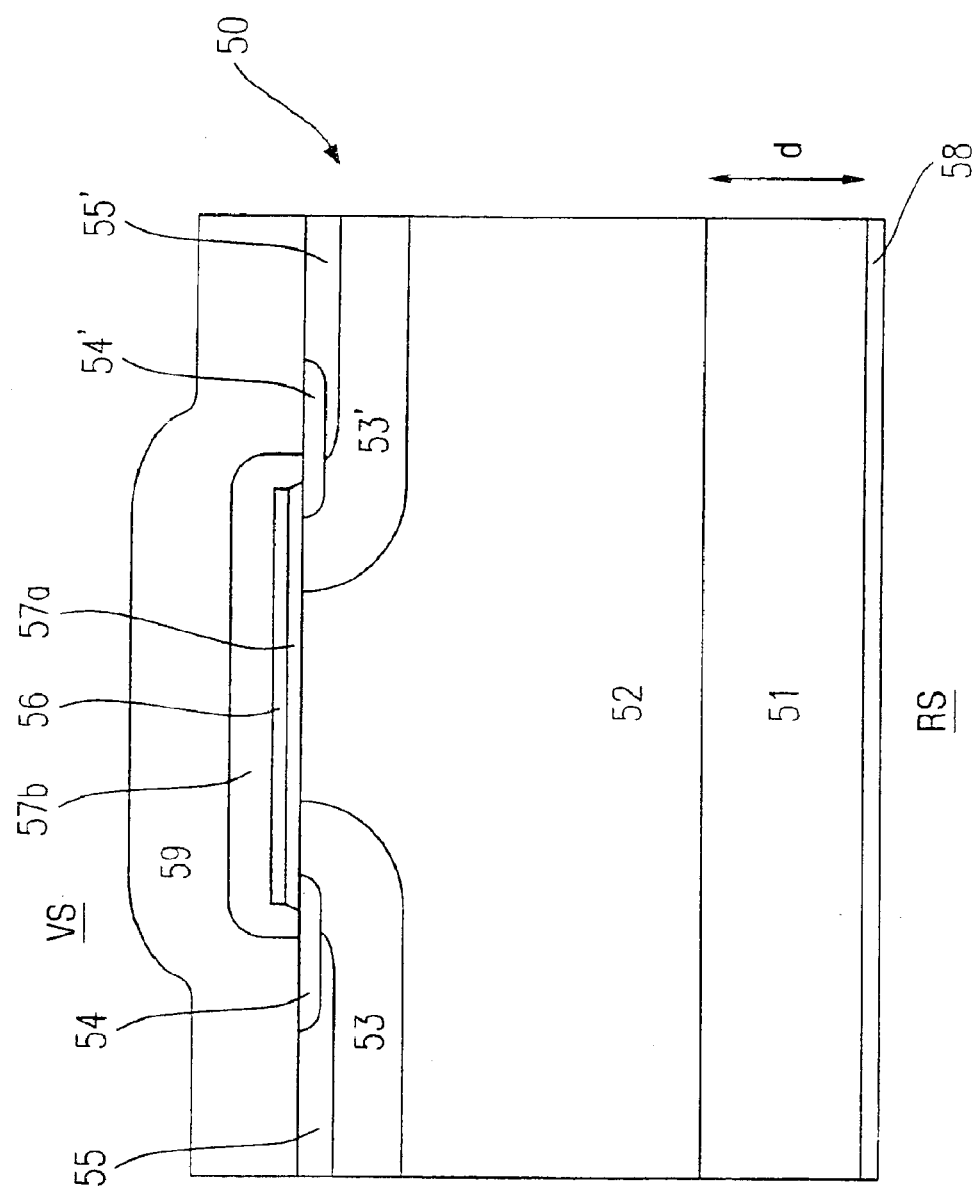
FIG. 1 shows a schematic cross-sectional diagram of a vertical NPT-IGBT according to one exemplary embodiment of the present invention.

The same reference numbers in the figures denote the same components or those having the same function.

FIG. 1 shows a schematic cross-sectional diagram of a vertical NPT-IGBT according to exemplary embodiment of the present invention.

FIG. 1 shows an active region 50 of an NPT-IGBT and a corresponding $n^-p^+$ substrate 51, 52. This substrate 51, 52 is either an $n^-$ wafer substrate including a rear-side $p^+$ diffusion or an $n^-p^+$ SDB crude wafer or an $n^-$ wafer substrate including a rear-side $p^+$ epitaxy layer.

As mentioned above, $n^-$ drift region 52 in said $n^-p^+$ substrate is the known drift region in active region 50 of the IGBT, and $p^+$ rear side 51 is the anode-side emitter.

FIG. 1 shows in particular a cross section through a cell and/or a strip within the active region of the IGBT without the passivation layers which are referred to in other systems. The entire active region may be obtained by monolithic integration of a plurality of such cells, i.e., strips side by side. The edge closure and/or the required clamp circuit according to FIG. 4 are executable according to the related art and are integratable into a chip together with the active region.

FIG. 1 also shows an anode contact 58, i.e., anode metallization on rear side RS of the wafer and a cathode contact 59, i.e., cathode metallization on front side VS of the wafer. Cathode contact 59 electrically connects regions 54 and 55 and/or 54' and 55' to each other. In this connection, 54, 54' denotes a front-side $n^+$ source region and 55, 55' a respective $p^+$ contact diffusion for connecting p-type body region 53, 53' beneath it. A gate electrode 56 may be made of polysilicon is electrically insulated by a gate oxide 57a from the semiconductor surface and by an intermediate dielectric 57b from cathode contact 59. $p^+$ regions 55, 55' are not only $p^+$ contact diffusions for electric connection of p-type body regions 53, 53' to cathode contact 59 but they also suppress latch-up. One inversion channel may be formed by a positive gate voltage on the surface of each of p-type body regions 53, 53'. $n^+$ source regions 54, 54' are used to resupply the electrons injected in the on state and/or the clamp case through the inversion channels into the low-doped $n^-$ drift region 52. The thickness of $n^-$ drift region 52 between the MOS control region and rear-side $p^+$ emitter region 51 is selected to be much larger than required by the width of the space charge region in $n^-$ drift region 52 at a defined, i.e., desired breakdown voltage of typically 400–600 V in ignition applications, e.g., 20 µm thick or more.

On the rear side of the wafer, $p^+$ emitter region 51 is provided with a depth d greater than 20 µm. The high $p^+$ doping provides ohmic contact binding of emitter 51 to rear-side anode contact 58. The IGBT according to this exemplary embodiment is manufacturable by standard manufacturing methods of semiconductor technology. The thickness of the crude wafer must not be less than for rear-side-diffused bipolar transistors of other systems despite the typical breakdown voltage of down to approx. 400 V. Therefore, no methods yielding very thin wafer thicknesses of less than 200 µm are necessary during the entire manufacturing process.

In the manufacture of this IGBT, first the front-side diffusions, oxides, metals, and cover layers are produced in/on the $p^+n^-$ substrate. Following that, rear side RS of the wafer is cleaned and conditioned, e.g., by a grinding and/or etching operation. The required amount of material to be removed will vary depending on the substrate used. For example, in the case of an RSD wafer, the amount of material to be removed will be as small as possible (a few µm), in the case of an SDB wafer it will be large (a few 100 µm), and in the case of an EPI/SUB wafer it will be small (a few µm). Finally, rear-side metallization 58 is applied. For precision equalization of the properties of the present IGBT, it is possible to introduce a targeted adjustment of the carrier lifetime, e.g., by electron bombardment.

In the finished IGBT, $n^-$ substrate region 52 of the crude wafer forms the drift region of the IGBT, and $p^+$ region 51 minus the layer removed during cleaning/conditioning forms the rear-side emitter. Use of an $n^-$ substrate having a long carrier lifetime in combination with the deep $p^+$ emitter region results in good conducting properties superior to those of comparable previous NPT-IGBTs including a transparent emitter. Due to the long carrier lifetime (more than 10 µs at high injection) achievable in the substrate in comparison with an n⁻ layer produced epitactically, the on-state voltage drop in the IGBT according to the present exemplary embodiment is as expected lower than with a comparably doped NPT-IGBT on a p⁺ substrate including an n⁻ epitaxy layer as the drift region.

In comparison with the NPT-IGBT on an SDB crude wafer discussed by Hobart et al., the present NPT-IGBT is simpler to manufacture. Since it is possible to start with a crude wafer having a standard wafer thickness (e.g., 700 µm) that has already been bonded, this eliminates the low-temperature bonding of thinned partially processed wafers. In addition, high-temperature methods of other systems may be used in the manufacture of the SDB crude wafers.

The shutdown behavior of the IGBT according to the present exemplary embodiment is not critical in the ignition application. First, a rapid subsidence of the anode current after shutting down the device voltage is not necessary as in other applications, but instead the anode voltage must be run up within times of less than a few 10 µs with the least possible dependence on temperature. On the other hand, the maximum switching frequency is approximately two orders of magnitude smaller in comparison with other applications. The high pulse strength of the IGBT according to the present exemplary embodiment results from the following facts. Due to the great thickness selected for n⁻ drift region 52, the current gain factor β of the pnp transistor formed by regions 51, 52, 53 and/or 53' is low even at a high off-state voltage. In addition, with comparable drift region doping, the field distribution in the NPT-IGBT is more favorable than in the PT-IGBT. The applied off-state voltage may be picked up at lower field strengths because the extent of the space charge region is not limited by a buffer. Therefore, the MOS control heads in the NPT-IGBT are heated to a lesser extent than in the PT-IGBT. The effect of positive feedback described above on the example of the PT-IGBT according to the related art via a thermally-induced electron leakage current therefore occurs only at higher loads on the component in the pulse case.

In addition, the thick n⁻ drift region may also be used for achieving a high pulse strength for another reason. It is known that the (gain) properties of an emitter may increase with an increase in temperature. This may not be desirable from the standpoint of a high pulse strength. An increase in gain results in a lower (thermally induced) leakage current, resulting in loss of controllability of the IGBT, than would be the case with temperature-independent gain. Therefore, the goal is to expose such emitters to no increase in temperature, which is achieved by a thick n⁻ drift region. In the pulse case, by far the greatest power loss occurs and thus heat is lost to the cathode side of the IGBT. The heat front requires a certain amount of time to reach the emitter. This time depends on the distance between the cathode side of the IGBT and the p⁺ emitter. It may be adjusted through the choice of a thick n⁻ drift region so that heating of the emitter during the critical phase in the pulse case remains slight and increases only thereafter.

Although the present invention has been described above on the basis of an exemplary embodiment, it is not limited to this but instead is modifiable in a variety of manners.

For example, if the types of doping and the polarity of the voltage to be applied are swapped, this yields a corresponding p-channel NPT-IGBT from the n-channel NPT-IGBT. In general, this is superior to the n-channel NPT-IGBT with regard to latch-up strength but is inferior with regard to avalanche strength.

What is claimed is:

1. A method of producing a semiconductor power component, the method comprising:
    preparing a wafer substrate of a first conductive type, including a rear-side emitter region of a second conductive type and a front-side drift region of the first conductive type;
    providing a front-side MOS control structure, including a front-side source region and a body region which are introduced into the front-side and a control contact, arranged as an insulated contact above the body region and above a part of the front-side drift region adjoining thereto;
    removing a portion of material of a rear side of the wafer substrate by at least one of an etching operation and a grinding operation;
    providing a rear-side anode contact connected to the rear-side emitter region and extending partially to the front-side; and
    providing a front-side cathode contact that is connected to a front-side source region of the front-side MOS control structure and the body region;
    wherein a thickness of the front-side drift region between the front-side MOS control structure and the rear-side emitter region is considerably larger than a width of a space charge region at a defined breakdown voltage, and a thickness of the rear-side emitter region is greater than 5 µm, the thickness of the front-side drift region being of such dimension that a temperature increase in the rear-side emitter region up to a point in time at which the front-side has reached a defined maximum temperature in a pulse case does not exceed a value of approximately 50K.

2. The method of claim 1, wherein the rear-side emitter region includes a diffusion region and the rear-side diffusion is performed before producing the front-side MOS control structure.

3. The method of claim 2, wherein a penetration of depth of the rear-side diffusion is more than 20 µm and removal of the portion of material on the rear side is a few µm.

4. The method of claim 2, wherein the lifetime of the charge carriers is adjusted by one of bombardment and a lifetime-reducing implantation.

5. The method of claim 1, wherein the wafer substrate includes an SDB substrate, and the removal of the material on the rearside of the wafer substrate is such that the remaining thickness of the rear-side emitter region is greater than 20 µm.

6. The method of claim 1, wherein the rear-side emitter region is an epitaxy region having a thickness greater than 5 µm, and the rear-side epitaxy is performed before providing the front-side MOS control structure.

7. A semiconductor power component comprising:
    a wafer substrate of a first conductive type, including a rear-side emitter region of a second conductive type and a front-side drift region of the first conductive type;
    a rear-side anode contact connected to the rear-side emitter region and extending partially to the front-side drift region;
    a front-side MOS control structure, including front-side source region and a body region which are introduced into the front-side drift region, and a control contact, arranged as an insulated contact above the body region and above a part of front-side the drift region adjoining thereto; and
    a front-side cathode contact connected to the front-side source region and the body region;

wherein a thickness of the front-side drift region between the front-side MOS control structure and the rear-side emitter region is considerably larger than a width of the space charge region at a defined breakdown voltage, and a thickness of the rear-side emitter region is greater than 5 μm, the thickness of the front-side drift region being of such dimension that a temperature increase in the rear-side emitter region up to point in time at which the front-side has reached a defined maximum temperature in a pulse case does not exceed a value of approximately 50.

8. The semiconductor power component of claim 7, wherein the defined breakdown voltage is less than 1000 V, and the thickness of the front-side drift region between the front-side MOS control structure and the rear-side emitter region is greater than 200 μm.

9. The semiconductor power component of claim 7, wherein the rear-side emitter region includes a diffusion region.

10. The semiconductor power component of claim 7, wherein the wafer substrate includes an SDB substrate.

11. The semiconductor power component of claim 7, wherein the rear-side emitter region includes an epitaxy region.

12. The semiconductor power component of claim 7, wherein the thickness of the front-side drift region between the front-side MOS control structure and the rear-side emitter region is at least 20 μm greater than the width of the space charge region at the defined breakdown voltage.

13. The semiconductor component power component of claim 7, wherein the first conductive type is a p-type and the second conductive type is a n-type.

14. The semiconductor power component of claim 7, wherein the front-side drift region has a carrier lifetime of more than 10 μs in high injection case.

* * * * *

UNITED STATES PATENT AND TRADEMARK OFFICE
CERTIFICATE OF CORRECTION

PATENT NO. : 6,949,439 B2 Page 1 of 1
APPLICATION NO. : 10/450222
DATED : September 27, 2005
INVENTOR(S) : Peter Flohrs et al.

It is certified that error appears in the above-identified patent and that said Letters Patent is hereby corrected as shown below:

Column 9, line 11, change "50" to --50K--

Signed and Sealed this

Tenth Day of April, 2007

JON W. DUDAS
*Director of the United States Patent and Trademark Office*